United States Patent [19]

Steigerwald

[11] Patent Number: 4,967,109
[45] Date of Patent: Oct. 30, 1990

[54] HIGH EFFICIENCY GATE DRIVER CIRCUIT FOR A HIGH FREQUENCY CONVERTER

[75] Inventor: Robert L. Steigerwald, Burnt Hills, N.Y.

[73] Assignee: General Electric Company, Schenectady, N.Y.

[21] Appl. No.: 447,948

[22] Filed: Dec. 8, 1989

[51] Int. Cl.⁵ .................. H03K 17/60; H03K 19/094
[52] U.S. Cl. .................... 307/571; 307/296.1; 307/451; 307/304; 307/559; 307/457
[58] Field of Search ............. 207/270, 585, 552, 557, 207/559, 542, 571, 576, 575, 584, 578, 255, 482, 585, 572

[56] References Cited

U.S. PATENT DOCUMENTS

| | | | |
|---|---|---|---|
| 4,224,535 | 9/1980 | Wilson et al. | 307/255 |
| 4,350,949 | 9/1982 | Fujia | 307/255 |
| 4,355,243 | 10/1982 | Tellert | 307/255 |
| 4,626,715 | 12/1986 | Ishii | 307/585 |
| 4,740,717 | 4/1988 | Fletcher | 307/572 |
| 4,760,282 | 7/1988 | Kuo et al. | 307/482 |
| 4,791,321 | 12/1988 | Tanaka | 307/559 |
| 4,845,605 | 7/1989 | Steigerwald | 363/21 |

OTHER PUBLICATIONS

W. A. Tabisz et al., "Zero-Voltage-Switched Quasi--Resonant Buck and Flyback Converters—Experimental Results at 10 MHz", Power Electronics Specialists Conference Record, pp. 404–413.

Primary Examiner—Stanley D. Miller
Assistant Examiner—Hanh Nguyen
Attorney, Agent, or Firm—Jill S. Breedlove; James C. Davis, Jr.; Marvin Snyder

[57] ABSTRACT

A high efficiency gate driver circuit for driving a power switching device of a high frequency power converter utilizes a series resonant circuit to reduce or substantially eliminate turn-on switching losses. The resonant circuit comprises the input capacitance of the power switching device and an inductance connected in series between the upper and lower switching devices of a half-bridge driver circuit. During device turn-on, the input capacitance resonates up to a voltage level approximately twice that of the gate drive power supply, and turn-on is substantially lossless. The input capacitance is prevented from discharging back to the supply by a Schottky diode connected in series between the supply and the upper switching device of the half-bridge. During device turn-off, the input capacitance discharges through the lower switching device.

11 Claims, 3 Drawing Sheets

HIGH EFFICIENCY GATE DRIVER CIRCUIT FOR A HIGH FREQUENCY CONVERTER

RELATED APPLICATIONS

This application is, related, to R.L. Steigerwald application Ser. No. 07/447,947 filed concurrently herewith.

FIELD OF THE INVENTION

This invention was made with Government support under contract N66001-87-C-0378 awarded by the Department of the Navy. The Government has certain rights in this invention.

The present invention relates generally to highfrequency power converters. More particularly, the present invention relates to a high efficiency gate driver circuit for driving a power switching device of a high frequency power converter.

BACKGROUND OF THE INVENTION

A conventional gate driver circuit used for driving a power switching device of a power converter utilizes semiconductor switching devices to turn on the power switching device and to discharge an input capacitance thereof when the power switching device is turned off. Such a conventional power switching device driver circuit loses approximately twice the energy stored in the device's input capacitance each time the device switches through an on and off cycle. Furthermore, as the operating frequency of a converter increases, power dissipation in the switching devices also increases. However, by operating the power converter at higher frequencies, smaller reactive components can be used, resulting in a smaller power supply. Thus, there is a tradeoff between power supply efficiency and size.

Accordingly, it is an object of the present invention to provide a new and improved gate driver circuit for driving a power switching device of a power converter.

Another object of the present invention is to provide a high efficiency gate driver circuit for driving a power switching device of a high frequency power converter which is small in size.

Still another object of the present invention is to provide a high efficiency gate driver circuit which requires a gate drive supply voltage of only approximately one-half the desired gate voltage of the power switching device.

Yet another object of the present invention is to provide a switching device driver circuit for a power converter which substantially eliminates gate switching losses during turn-on of the power switching device.

SUMMARY OF THE INVENTION

The foregoing and other objects are achieved in a new and improved high efficiency gate driver circuit for driving a power switching device of a high frequency power converter. The new driver circuit includes first and second switch means for respectively turning on and off the power switching device, and resonant circuit means for charging the input capacitance of the switching device to a predetermined level, preferably twice the gate drive supply voltage level. Advantageously, therefore, the gate drive supply voltage is required to be only approximately one-half the desired gate voltage of the power switching device. The resonant circuit means reduces the switching losses, described hereinabove with respect to conventional drivers, by approximately one-half. Blocking means prevents the input capacitance from discharging back to the gate drive power supply through the first switch means.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figure 1:
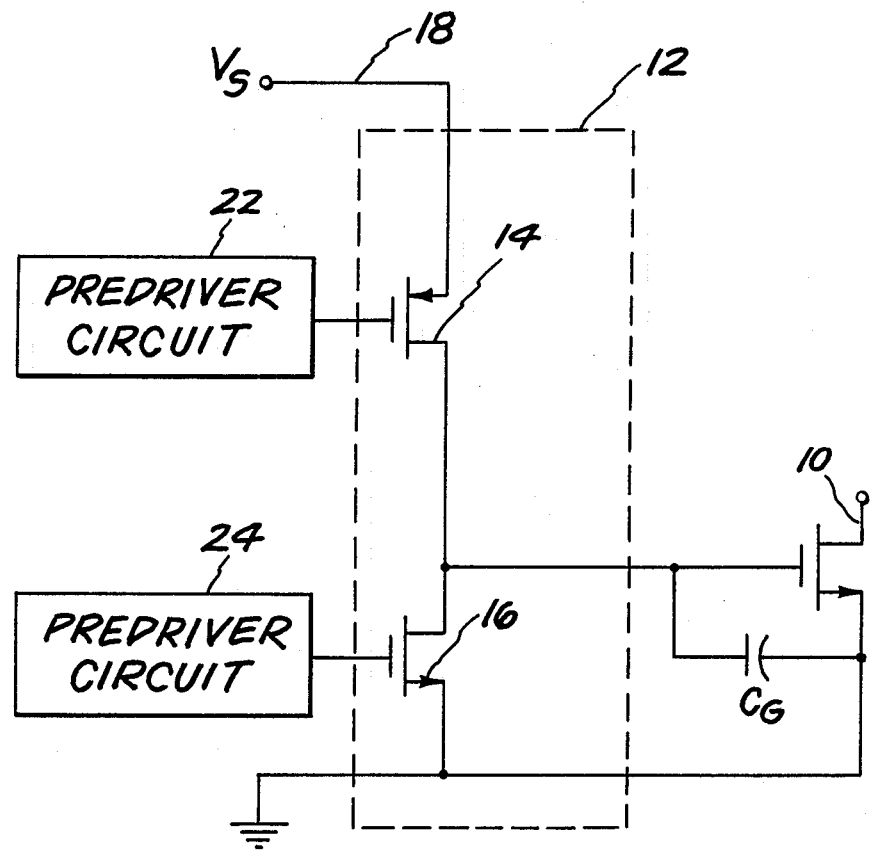
FIG. 1 is a schematic diagram of a conventional gate driver circuit for driving a power MOSFET of a power converter.

A conventional gate driver circuit 12 for driving a power switching device 10 of a power converter (not shown) is illustrated in FIG. 1. The power converter may be of any type known in the art which employs power semiconductor switching devices which have capacitive gates and generate an output voltage from segments of an input signal, thereby converting ac power to dc, dc power to ac, or dc power to dc, as desired. The power switching device 10 shown in FIG. 1 may comprise, for example, the single primary-side power switching device of a single-ended power supply. Single-ended converters are described in commonly assigned U.S. Pat. No. 4,845,605 of R.L. Steigerwald, issued on July 4, 1989, which patent is hereby incorporated by reference.

The conventional gate driver 12 of FIG. 1 comprises two semiconductor bidirectional switching devices 14 and 16 connected in series in a half-bridge configuration between a positive conductor 18 at the potential of the gate drive voltage supply $V_s$ and ground. The power switching device 10 is illustrated as a MOSFET, but any other type of switching device which has a capacitive gate may be used, such as an insulated gate bipolar transistor (IGBT) or a MOS-controlled thyristor (MCT). Switching devices 14 and 16 are also illustrated in FIG. 1 as MOSFET's, but any suitable switching device may be used, including bipolar junction transistors (BJT's). Therefore, it is by way of example only that device 14 is illustrated as a p-channel type MOSFET and device 16 is illustrated as an n-channel type MOSFET.

To turn on the power switching device 10, a pre-driver circuit 22 of a type well-known in the art, such as a type DS0026 driver manufactured by National Semiconductor Corporation, provides a turn-on signal to the gate of device 14 which, in turn, provides a turn-on signal to the gate of the power MOSFET 10. The input capacitance $C_G$ of power MOSFET 10 charges through device 14 to approximately the gate drive supply voltage level $V_s$. Since the device 14 acts essentially as a resistance while it is conducting, power is dissipated as the input capacitance charges. The amount of energy E dissipated is given by:

$$E = \tfrac{1}{2} C_G V_S^2$$

Similarly, when device 16 is turned on by a predriver circuit 24 (and device 14 is off), the input capacitance $C_G$ discharges through device 16 which acts as a resistance to dissipate substantially the same amount of power given by the equation for energy E above. Therefore, the total amount of energy $E_T$ dissipated during each cycle of switching on and off power MOSFET 10 is given by:

$$E_T = C_G V_S^2$$

Figure 2:
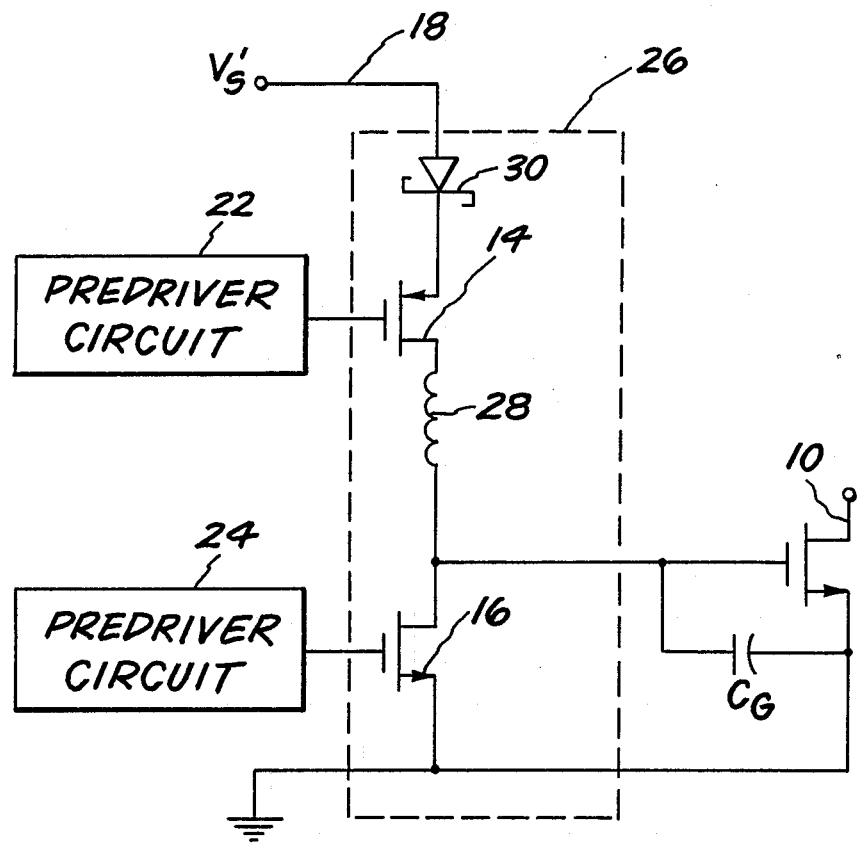
FIG. 2 is a schematic diagram of a gate driver circuit according to a preferred embodiment of the present invention useful for driving a power MOSFET such as that of FIG. 1.

FIG. 2 illustrates an improved gate driver circuit 26, according to a preferred embodiment of the present invention, which is useful for driving a power switching device of a power converter, such as power MOSFET 10 of FIG. 1. A small inductance 28 is connected in series with devices 14 and 16, and a unidirectional current device such as a Schottky diode 30, is connected in series between positive conductor 18 and device 14. Inductance 28 can be implemented, for example, using an inductor having an inductance value in the range of approximately 10 to 20 nanohenries. Such an inductor 28 can be formed from one or two turns of wire having a one centimeter diameter. Advantageously, the inductor's lead wires can provide a substantial portion of the desired inductance value.

When a turn-on signal is applied to the gate of device 14 in order to turn on power MOSFET 10, the voltage across input capacitance $C_G$ resonates with inductor 28; and the voltage across capacitance $C_G$ "rings up" to approximately twice the gate drive supply voltage level, or $2V_S'$, where voltage $V_S'$ is preferably equal to one-half the conventional gate drive supply voltage designated hereinabove as $V_S$. The gate circuit ringing frequency is typically at least ten times the switching repetition rate of power MOSFET 10. The voltage across the input capacitance $C_G$ of power MOSFET 10 reaches nearly twice the level of the gate drive supply voltage, because energy is stored in the inductor 28 during the first portion of the turn-on interval and is released during the latter part of the turn-on interval, according to a well-known property of series RLC circuits, as will be illustrated hereinafter. Hence, the supply voltage level is required to be only approximately one-half of the desired voltage level across input capacitance $C_G$. Practically, since circuit elements are nonideal, the gate drive supply voltage would have to be slightly higher than one-half the level $V_S'$.

Figure 3A:
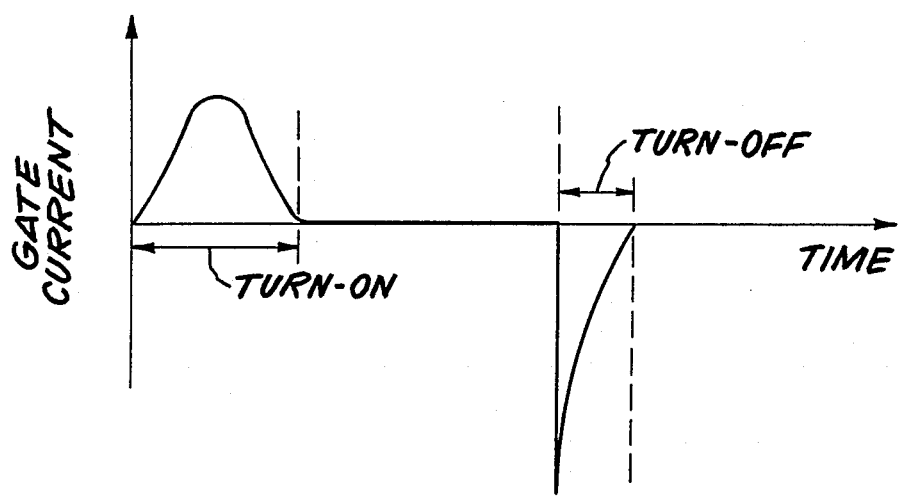
FIGS. 3A and 3B are graphical illustrations of current and voltage waveforms useful in describing the operation of the gate driver circuit of FIG. 2.
Figure 3B:
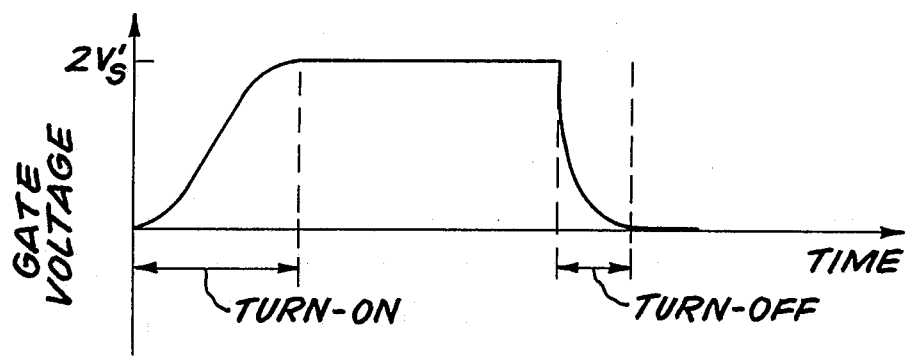

FIGS. 3A and 3B graphically illustrate the gate current for MOSFET 10 of FIG. 2 and the corresponding gate (i.e. input capacitance) voltage, respectively, assuming that only ideal circuit elements are employed in the circuit of FIG. 2. In particular, if power MOSFET 10, switching devices 14 and 30, inductor 28, and diode 30 were ideal, i.e. nonresistive, elements there would be no gate losses during the charging or turn-on period. In actuality, there are some slight losses due to the internal resistances of these circuit elements. However, the total resistance of these elements is small, thus resulting in low power losses during turn on of power MOSFET 10 as compared with the conventional driver as described hereinabove.

As shown in FIG. 3A, during the first portion of the turn-on interval, the gate current increases as energy is stored in the inductor 28. Then, during the latter part of the turn-on interval, the gate current decreases as energy is released by inductor 28 into the input capacitance $C_G$. At the end of the turn-on interval, as shown in FIG. 3B, the input capacitance voltage reaches level $2V_S'$. After the capacitance $C_G$ has charged to level $2V_S'$, power device 10 is fully on, and predriver circuit 22 turns off device 14. In accordance with the present invention, the input capacitance $C_G$ is prevented from discharging back to the gate drive supply $V_S'$ by Schottky diode 30.

When it is desired to turn off power device 10, device 16 is turned on by predriver circuit 24. This results in a current spike, as illustrated in FIG. 3A, through lower device 16 which is limited by the resistance thereof. Input capacitance $C_G$ discharges through device 16, as in the conventional scheme. As shown in FIG. 3B, the voltage across input capacitance $C_G$ thus decreases to zero. In FIG. 3A, the area under the turn-on gate current curve and the substantially equl area under the turn-off gate current curve respectively represent the charge stored on and removed from the input capacitance $C_G$ during power device turn-on and turn-off, respectively.

The power switching device driver circuit of the present invention ideally eliminates gate driver power dissipation during device turn-on, thereby reducing switching power dissipation in the driver by approximately one-half, as compared with the conventional driver shown in FIG. 1.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. An efficient gate driver circuit for driving a semiconductor power switching device of a high-frequency power converter, said power switching device having an input capacitance, comprising:

a first switch means for coupling to a gate drive power supply for turning ons aid power switching device;

a second switch means coupled in series with said first switch means for turning off said power switching device;

inductance means coupled in series with said first and second switch means, said first and second switch means thereby being coupled in a half-bridge configuration, said inductance means being of a size selected to resonate with said input capacitance and to charge said input capacitance to a predetermined lelve when said power switching device is turned on; and blocking means coupled in series with said first switch means for preventing said input capacitance from discharging through said first switch means to said gate drive power supply.

2. The driver circuit of claim 1 wherein said power switching device comprises a MOSFET.

3. The driver circuit of claim 1 wherein said power switching device comprises an insulated gate bipolar transistor.

4. The driver circuit of claim 1 wherein said power switching device comprises a MOS-controlled thyristor.

5. The driver circuit of claim 1 wherein said first and second switch means each respectively comprises a first and a second semiconductor bidirectional switching device, respectively.

6. The driver circuit of claim 5 wherein said first and second bidirectional switching devices each comprises a MOSFET.

7. The driver circuit of claim 1 wherein said blocking mean comprises a unidirectional current device.

8. The driver circuit of claim 7 wherein said unidirectional current device comprises a Schottky diode.

9. An efficient gate driver circuit for driving a semiconductor power switching device of a high-frequency power converter, said power switching device having an input capacitance, comprising:

a first switch means for turning ons aid power switching device;

a second switch means coupled in series with said first switch means for turning off said power switching device;

inductance means coupled in series with said first and second switch means, said first and second switch means thereby being coupled in a half-bridge configuration, said inductance means being of a size selected to resonate with said input capacitance and to charge said input capacitance to a predetermined level when said power switching device is turned on; and blocking emans for coupling to a gate drive power supply, said blocking means being coupled to said first switch means so as to prevent said input capacitance from discharging through said first switch means to said gate drive power supply.

10. The driver circuit of claim 9 wherein said blocking means comprises a unidirectional current device.

11. The driver circuit of claim 10 wherein said unidirectional current device comprises a Schottky diode.

* * * * *